(12) United States Patent
Ferri et al.

(10) Patent No.: US 8,716,592 B2
(45) Date of Patent: May 6, 2014

(54) THIN FILM PHOTOVOLTAIC ASSEMBLY METHOD

(75) Inventors: Louis Anthony Ferri, Solon, OH (US); Kevin Zuege, Madison, OH (US)

(73) Assignee: Quanex IG Systems, Inc., Cambridge, OH (US)

( * ) Notice: Subject to any disclaimer, the term of this patent is extended or adjusted under 35 U.S.C. 154(b) by 1088 days.

(21) Appl. No.: 10/889,521

(22) Filed: Jul. 12, 2004

(65) Prior Publication Data
US 2006/0005874 A1  Jan. 12, 2006

(51) Int. Cl.
*H01L 27/142*  (2014.01)
(52) U.S. Cl.
USPC .............. 136/251; 136/244; 438/64; 438/66
(58) Field of Classification Search
USPC ........ 428/441; 438/110, 64, 66; 136/251, 244
See application file for complete search history.

(56) References Cited

U.S. PATENT DOCUMENTS

| | | | | |
|---|---|---|---|---|
| 4,064,521 A | | 12/1977 | Carlson | 357/2 |
| 4,137,098 A | | 1/1979 | Field | 136/89 |
| 4,224,081 A | * | 9/1980 | Kawamura et al. | 136/251 |
| 4,373,308 A | | 2/1983 | Whittaker | 52/173 |
| 4,587,376 A | | 5/1986 | Kosaka et al. | 136/248 |
| 4,724,010 A | | 2/1988 | Okaniwa et al. | 136/246 |
| 4,758,624 A | | 7/1988 | Sekiguchi et al. | 525/101 |
| 4,879,251 A | * | 11/1989 | Kruehler et al. | 438/80 |
| 5,061,749 A | | 10/1991 | Ito et al. | 524/850 |
| 5,128,181 A | | 7/1992 | Kunert | 428/34 |
| 5,221,363 A | | 6/1993 | Gillard | 136/248 |
| 5,228,925 A | | 7/1993 | Nath et al. | 136/251 |
| 5,241,014 A | | 8/1993 | Kehr et al. | 525/376 |
| 5,252,141 A | * | 10/1993 | Inoue et al. | 136/251 |
| 5,273,593 A | | 12/1993 | Marquardt et al. | 136/251 |
| 5,340,887 A | | 8/1994 | Vincent et al. | 525/477 |
| 5,355,089 A | | 10/1994 | Treger | 324/435 |

(Continued)

FOREIGN PATENT DOCUMENTS

| | | |
|---|---|---|
| DE | 38 01 989 A1 | 7/1989 |
| EP | 01 99 233 A1 | 10/1986 |

(Continued)

OTHER PUBLICATIONS

IVF Electronics—EP News—May 99; "IVF and the Grätzel Cell"; Internet web site article at http://www.ivf.se/Elektronic/Ep/EP-News/EPNews992/new299.htm.

(Continued)

*Primary Examiner* — Golam Mowla
(74) *Attorney, Agent, or Firm* — Zollinger & Burleson Ltd.

(57) ABSTRACT

The present invention relates to a method of manufacturing thin film photovoltaic panels (TFPP). Instead of utilizing a conventional EVA based adhesive layer, material, the present invention uses an adhesive layer that may be applied in a liquid form and cures rapidly to form the TFFP. In one embodiment, the method provides for applying an adhesive layer in a liquid form along at least a portion of the exposed photovoltaic layer and substrate. In another embodiment, the method provides for applying a first layer adhesive in liquid form along at least one edge of the substrate and second layer of adhesive in liquid form generally bound by the first layer of adhesive. After application of the adhesive layer(s), a force may then be applied to adhere the front panel (or substrate), photovoltaic material layer, adhesive layer and backing panel and the adhesive layer transforms from a liquid to a solid.

18 Claims, 6 Drawing Sheets

(56) References Cited

U.S. PATENT DOCUMENTS

| | | | |
|---|---|---|---|
| 5,460,660 A | 10/1995 | Albright et al. | 136/251 |
| 5,476,553 A * | 12/1995 | Hanoka et al. | 136/251 |
| 5,478,402 A | 12/1995 | Hanoka | 136/251 |
| 5,524,401 A | 6/1996 | Ishikawa et al. | 52/173.3 |
| 5,733,382 A | 3/1998 | Hanoka | 136/251 |
| 5,800,631 A * | 9/1998 | Yamada et al. | 136/251 |
| 5,849,832 A | 12/1998 | Virnelson et al. | 524/512 |
| 5,994,474 A | 11/1999 | Wey et al. | 525/288 |
| 6,027,958 A * | 2/2000 | Vu et al. | 438/110 |
| 6,048,433 A * | 4/2000 | Maesaka et al. | 156/314 |
| 6,177,519 B1 | 1/2001 | Chung et al. | 525/263 |
| 6,235,848 B1 | 5/2001 | Bickert et al. | 525/326.5 |
| 6,281,288 B1 | 8/2001 | Bickert et al. | 525/72 |
| 6,288,326 B1 | 9/2001 | Hayashi et al. | 136/251 |
| 6,673,997 B2 | 1/2004 | Blieske et al. | 136/251 |
| 6,709,750 B1 | 3/2004 | Pohlmann et al. | 428/441 |
| 2001/0015220 A1* | 8/2001 | Benz et al. | 136/251 |
| 2001/0054262 A1* | 12/2001 | Nath et al. | 52/173.3 |
| 2002/0038664 A1* | 4/2002 | Zenko et al. | 136/251 |

FOREIGN PATENT DOCUMENTS

| | | |
|---|---|---|
| EP | 01 99 233 B1 | 1/1990 |
| EP | 0 762 514 A2 | 3/1997 |
| EP | 0 769 818 A2 | 4/1997 |
| EP | 1 054 456 A2 | 11/2000 |
| GB | 20 31 224 | 4/1980 |
| JP | 07249789 A | 9/1995 |
| JP | 10018514 A | 1/1998 |
| JP | 10018515 A | 1/1998 |
| JP | 11054780 | 2/1999 |
| JP | 11340494 A | 12/1999 |
| JP | 2002211498 A | 7/2002 |
| WO | 97/15619 | 5/1997 |
| WO | 00 46 860 | 8/2000 |
| WO | WO 2004019421 | 3/2004 |

OTHER PUBLICATIONS

Wey; "Polar and Reactive: VESTOPLAST with new Properties"; Paper presented at the Munich Adhesives and Processing Seminar 1997.

* cited by examiner

THIN FILM PHOTOVOLTAIC ASSEMBLY METHOD

FIELD OF THE INVENTION

This invention relates to a method for manufacturing thin film photovoltaic panels and, more particularly, laminating substrates with thin film circuitry deposited thereon to construct solar panels.

BACKGROUND OF THE INVENTION

Generally, there exists two types of photovoltaic panels used for capturing solar energy for conversion to electrical power. One type of solar panel is crystalline silicon wafer panel while the other type is the so-called thin film photovoltaic panels (TFPP). As the name suggests, a crystalline silicon wafer panel design employs crystalline silicon wafers connected together and embedded in a laminating film. The laminating film and the wafers embedded therein are typically sandwiched between two lites, or panels, of glass, a polymeric material or other suitable materials.

The TFPP design, which is of primary interest herein, employs one of amorphous silicon, cadmium-telluride (Cd—Te) or copper-indium-diselenide, $CuInSe_2$ (commonly referred to as "CIS"), or a similar semiconductor material such as mentioned below, which is deposited on a substrate in a thin film. These thin film photovoltaic materials are typically deposited in a thin film on a substrate by a method such as sputter coating, physical vapor deposition (PVD) or chemical vapor deposition (CVD). The photovoltaic material of the TFPP is often covered by a sputtered layer of aluminum, which acts to protect the underlying structures. The individual photocells are then typically formed by a laser etching process, and are connected together by suitable circuitry, such as a buss bar. The buss bar transfers the electrical current output from the photocells to a storage device such as a battery or directly to a load. To complete the construction, a laminating adhesive is applied over the photovoltaic material, associated circuitry, and any protective layer which is present, and a backing panel is then applied. The backing panel is typically glass, but may be metal, a composite or a plastic material.

The circuitry, such as a buss bar which collects the electrical current generated by the solar panel must be connected by wiring to a suitable storage device, such as a battery or directly to a load. Such wiring may be referred to as a "module wire" or "module lead". The module wire must exit the solar panel at some point. Additional adhesive or sealant material is needed to seal around the module wire exiting the solar panel. The adhesive used for sealing around module wires may be the same as, or may differ from, the laminating adhesive used to attach the backing material to the solar panel.

TFPP's are used outdoors, and so are exposed to the elements, including wind, water and sunlight. TFPP's are deleteriously affected primarily by moisture which may permeate into the panel, reaching the electrical connections or the photovoltaic materials. Water penetration into solar panels has been a long-standing problem. Thus, various attempts have been made to reduce the moisture vapor transmission rate (MVTR) of the laminating film. Solar panels may also be deleteriously affected by wind and sunlight, which may result in failure of the adhesive layer. Wind can cause physical damage such as stresses on the adhesive layer while sunlight can result in heating of the solar panel and exposure to ultraviolet (UV) radiation. Operating temperatures of solar panels have been measured as high as 110° C.

A commonly used laminating adhesive is ethylene vinyl acetate (EVA). The EVA is applied as a film to the photovoltaic material. The film is formulated to contain a peroxide, which is designed to crosslink the EVA. The EVA is then cured in place on the solar panel by application of heat or radiation, which causes the peroxide to crosslink the EVA. Crosslinked EVA provides high strength at room temperature and adequate strength at operating temperatures, but suffers from a relatively high MVTR. The MVTR can be in the range of 40-50 grams of H2O/meter2/per day measured 37 C.

The typical manufacturing process for thin film photovoltaic panels requires cutting the laminating film to an appropriate size and includes removing any portion of the film that may cover electrical connections. The film is then sandwiched between the substrate containing the photovoltaic semiconductor material and a backing material, typically glass. This structure is then heated and pressed to affect a cure and cross-link the EVA. A vacuum may be applied to remove air trapped between the film and the substrate. The total time to assemble and heat and cure each solar panel is significant, approaching 15 to 20 minutes per panel. By reducing the manufacturing time, the efficiency of TFPP manufacturing can be greatly improved. The current manufacturing technique is necessitated because of the need to cure EVA.

The present invention improves manufacturing efficiency by changing the application technique and cure chemistry of the laminating adhesive.

SUMMARY OF THE INVENTION

The method of manufacturing of the present invention greatly improves the efficiency associated with manufacturing TFPPs by changing the laminating adhesive from an EVA based material to an adhesive (e.g. a single, dual or multi-component hot melt adhesive or a single, dual or multi-component curing adhesive) that may be applied in a liquid form and cures rapidly to form the TFFP.

One aspect of the present invention relates to a method for manufacturing a thin film photovoltaic panel by providing a photovoltaic material layer on a substrate having a plurality of edges, applying an adhesive layer in a liquid form along at least a portion of the substrate, and securing the substrate to the backing panel with at least a portion of the adhesive layer, wherein the adhesive layer changes from the liquid form to a solid form. Alternatively, the adhesive can be applied to the backing panel and then secured to the substrate.

Another aspect of the present invention relates to method of manufacturing a thin film photovoltaic panel by applying a first layer of adhesive around the edges of a substrate carrying a photovoltaic material, applying a second layer of an adhesive within the area bound by the first layer of adhesive and securing a back panel to the layered structure.

Yet another aspect of the present invention relates to a method of manufacturing a thin film photovoltaic panel by applying a first layer of adhesive around the edges of a substrate carrying a photovoltaic material and curing that layer, applying a second layer of an adhesive within the area bound by the first layer of adhesive, and securing a back panel to the layered structure.

Another aspect of the present invention relates to a method of manufacturing a thin film photovoltaic panel by applying a first layer of adhesive around the edges of a substrate carrying a photovoltaic material, applying and curing a second layer of an adhesive within the area bound by the first layer of adhesive, and securing a back panel to the layered structure.

A further aspect of the present invention relates to a method of manufacturing a thin film photovoltaic panel by applying and curing a first layer of adhesive around the edges of a substrate carrying a photovoltaic material, applying and curing a second layer of an adhesive within the area bound by the first layer of adhesive, and securing a back panel to the layered structure.

Figure 1:
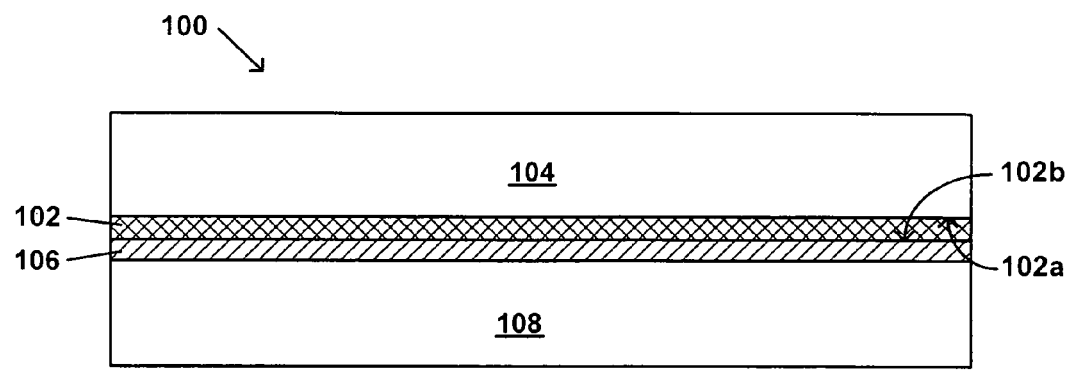
FIG. 1 is a schematic cross-sectional view of layers associated with the thin film photovoltaic panel of the present invention.

It should be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

Furthermore, it should be appreciated that the process steps and structures described below do not form a complete process flow for manufacturing solar panels. The present invention can be practiced in conjunction with thin film photovoltaic panel (or solar panel) fabrication techniques currently used in the art, and only so much of the commonly practiced process steps are included as are necessary for an understanding of the present invention.

DETAILED DESCRIPTION OF THE INVENTION

The method of manufacturing of the present invention greatly improves the efficiency of manufacturing TFPPs. The present invention uses an adhesive layer that may be applied in a liquid to form the TFFP. A suitable adhesive layer in accordance with the present invention includes pumpable liquid adhesives, such as single, dual or multi-component hot-melts, thermosets, or reactive hot-melts.

One embodiment of a thin film photovoltaic solar panel (TFPP) 100 in accordance with the present invention is shown in a cross-sectional schematic view in FIG. 1. The TFPP 100 includes a photovoltaic material layer 102. A first surface 102*a* of the photovoltaic material layer 102 is disposed on and attached to a transparent front panel (or substrate) 104. One of skill in the art will readily appreciate that the photovoltaic material layer 102 need not extend all the way to the edges of the front panel, but may only be disposed over a portion of the front panel. On a second surface 102*b* of the photovoltaic material layer 102 is disposed an adhesive composition layer 106. The adhesive layer 106 forms a bond between the photovoltaic material layer 102 and a backing panel 108.

The TFPP 100 may be fabricated by depositing the photovoltaic material layer 102 (e.g., amorphous silicon) on the front panel 104. As noted, the front panel 104 may be formed of any appropriate material, and in many instances the material is glass. The photovoltaic material layer 102 may be deposited by any appropriate means known in the art. For example, amorphous silicon may be deposited by chemical vapor deposition (CVD), by physical vapor deposition (PVD), by sputtering or by any other known method.

Figure 2:
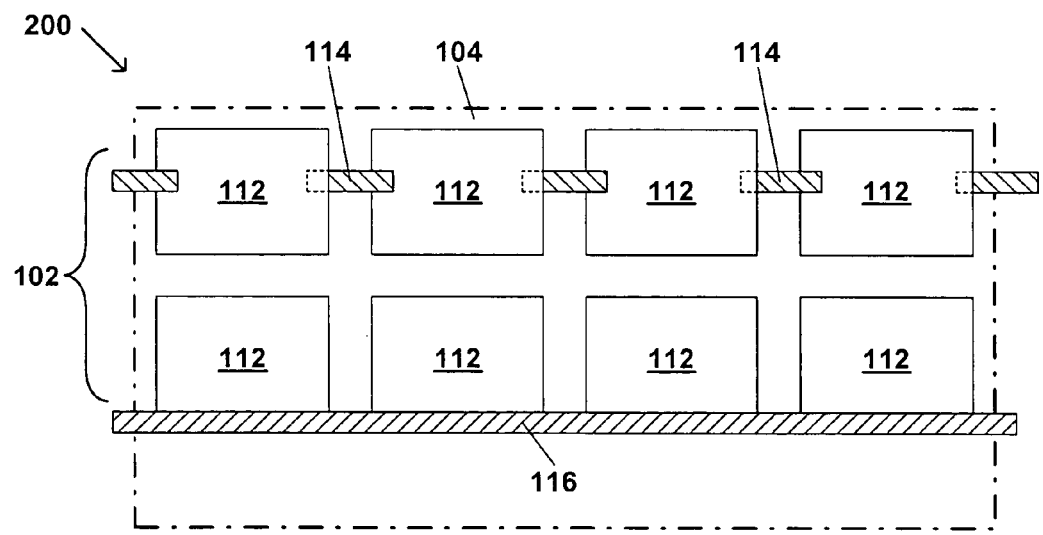
FIG. 2 is a schematic plan view of a thin film photovoltaic panel.

When the photovoltaic material layer 102 has been deposited on the front panel 104, the photovoltaic layer 102 is etched to define a plurality of individual photocells 112, as shown in FIG. 2. Thus, the plurality of individual photocells 112 are substantially the same as the layer 102 shown in cross-sectional view in FIG. 2. The etching may be by application of a laser etching, or by other suitable means, including chemical etching and other etching methods known in the semiconductor arts.

The individual photocells 112 must be electrically connected so that the electrical current generated by the photocells can be collected and carried to a location at which the generated electrical current can be utilized. Thus, an electrical connection, such as a buss bar or other suitable wiring, is applied to the TFPP 200 to provide an electrical connection between respective ones of the plurality of individual photocells 112 and the exterior of the TFPP 200. The wiring is connected from one photocell 112 to another as known in the art.

FIG. 2 shows two embodiments of such wiring. First, in the upper row of photocells 112 in FIG. 2, there is schematically shown a series of photocell to photocell wiring connections 114. As shown in FIG. 2, this series of wiring connections 114 connects from one side a first photocell 112 to the opposite side of an adjacent photocell 112, or to the exterior of the TFPP 200. This side to side connection is indicated by the dashed and solid lines at the point of attachment of the wiring connection 114 to each respective photocell 112. The second embodiment of electrical connection is shown in the lower row of photocells 112, which schematically shows a buss bar 116. The buss bar 116 provides an electrical connection from photocell to photocell and to the exterior of the TFPP 200.

The adhesive layer 106 may be applied to be in direct contact with the photovoltaic material layer 102 in an embodiment such as shown in FIG. 1. The adhesive layer 106 is also in contact with the backing panel 108. Of course, the adhesive may be initially applied to either the backing panel 108 or to the photovoltaic material layer 102 or the protective layer 110, and then subsequently brought into contact with the opposite layer secured together. Thus, the adhesive layer 106 is disposed between and adheres together the photovoltaic material layer 102 and the backing panel 104, with the protective layer 110 intervening between these layers in some embodiments.

The adhesive layer 106 is often referred to as an laminating adhesive, since it is used to assemble and hold together the elements of the solar panel. It is contemplated that any pumpable liquid adhesive can be used as the adhesive layer 106. Types of pumpable adhesives contemplated for use as the adhesive layer 106 include hot-melts, thermosets, reactive hot-melts or other curing adhesives. A desirable characteristic of these adhesives is that they may be applied in a liquid form and may change from a liquid to a solid in a short period of time.

Preferably, the adhesive layer 106 can include single, dual or multi-component curing hot melt adhesives or a single, dual or multi-component curing adhesive. The adhesive layer 106 is applied to the substrate 104 containing the photovoltaic layer 102 using any of the known methods to substantially cover the entire substrate.

Figure 3:
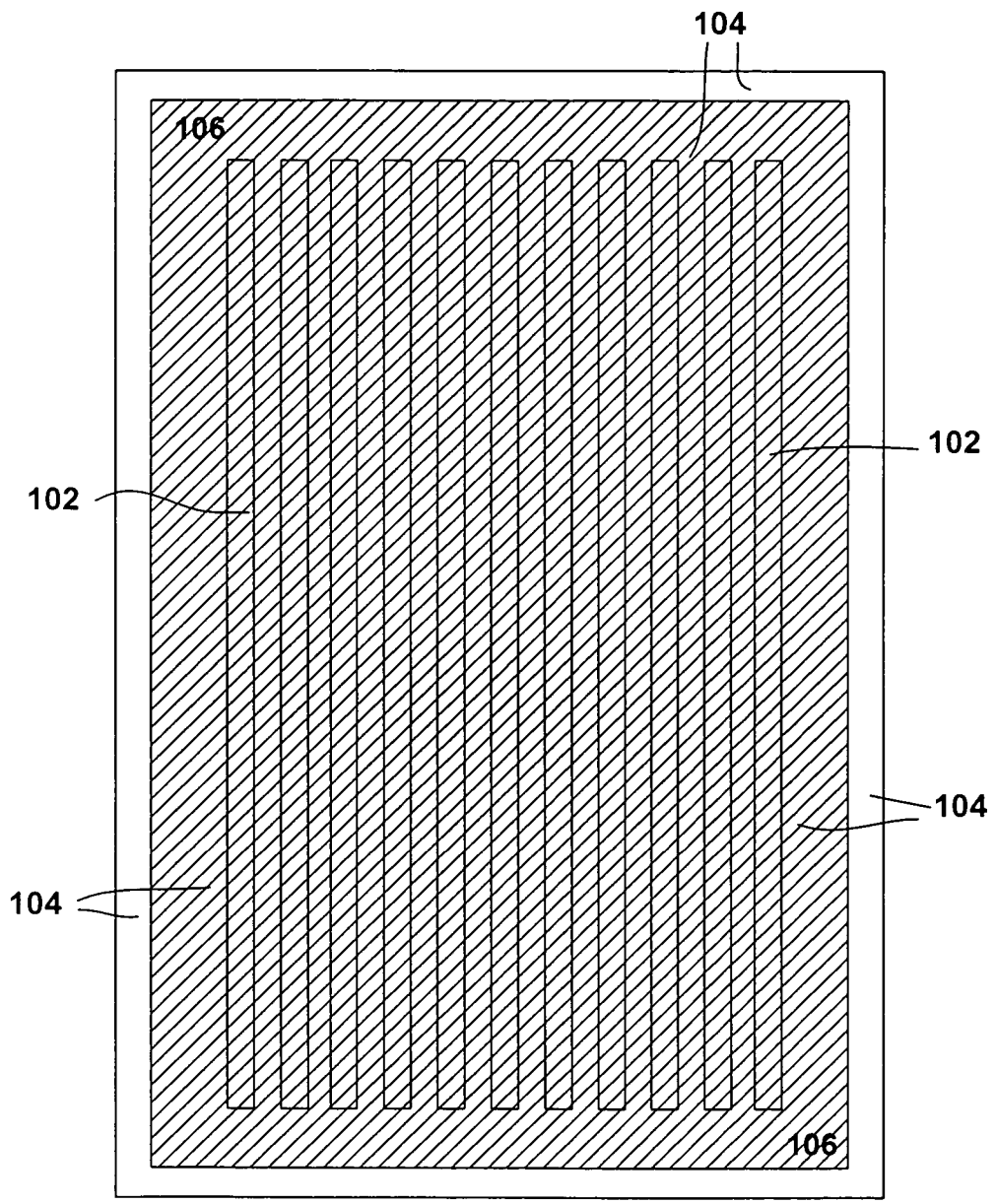
FIG. 3 is a schematic plan view of the formation of an adhesive layer in accordance with the present invention.

One method of applying the adhesive layer 106 is shown in FIG. 3. The photovoltaic layer 102 is deposited over the front panel 104. An adhesive layer 106 is applied over substantially the entire exposed surface of the front panel 104 and photovoltaic layer 102 by any method known in the art (e.g., spraying, extrusion, roll coating, spreading with an appropriate device such as a doctor blade, automated X-Y axis application or other conventional methods. Although not shown in FIG. 3, any portion of the substrate 104 containing the photovoltaic semiconductor material that is desired to not be covered by an adhesive layer can be masked or application of the adhesive can be arranged to avoid adhesive being applied to that particular portion of the substrate. When using a mask, it should be understood that the mask is removed following application of the adhesive layer.

Figure 4:
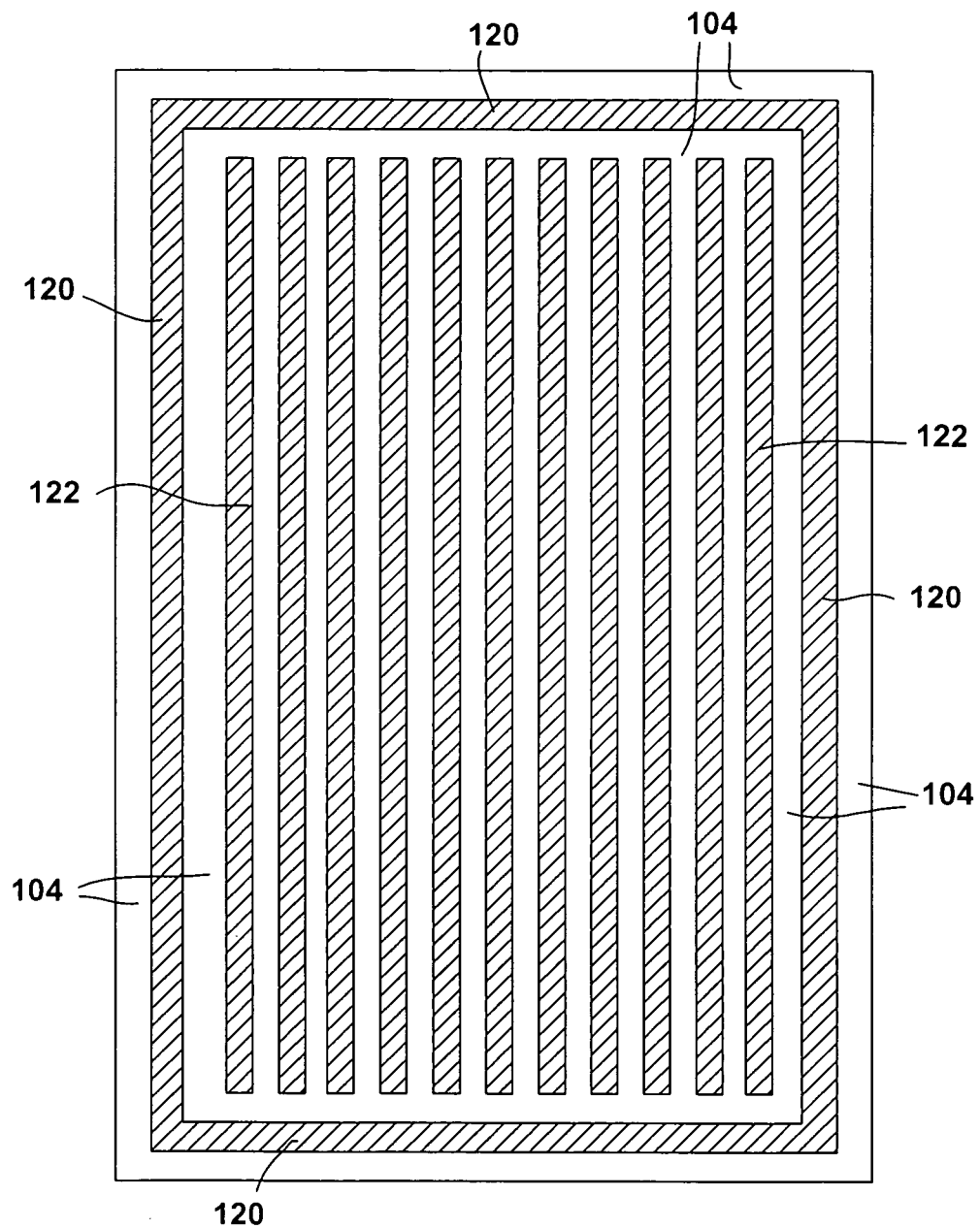
FIG. 4 is a schematic plan view of the formation of the adhesive layers in accordance with the present invention.

Another method for applying the adhesive layer 106 in accordance with the present invention provides for utilizing an automated X-Y axis application to apply a bead comprised of adhesive layer 106 to form a perimeter dam 120, as shown in FIG. 4. The perimeter dam 120 is formed substantially along the entire edge of the substrate 104. The perimeter dam 120 can be formed using a single component curing hot melt adhesive that is applied as a bead. Alternatively, the perimeter dam 120 can be formed using any other suitable adhesive described above, applied as a bead.

After the perimeter dam 120 is formed, a second application of adhesive material (typically the same adhesive used in forming the perimeter dam 120) is applied. The second application of the same adhesive material is applied at a higher temperature (and lower viscosity) than the first adhesive layer used to form the perimeter dam 120. The second application is applied to the area bounded by the perimeter dam 120. The second application, which has a lower viscosity than the first application, is compatible with the first application (since it is the same material) and also serves to wet and cover the majority of the photovoltaic layer 102. The second application of the adhesive layer may be by any appropriate method known in the art as long it does not disturb the perimeter dam. For example, the adhesive composition may be applied by spraying, extrusion, spreading with an appropriate device such as a doctor blade, and other conventional methods.

It should be readily apparent to one of skill in the art that the perimeter dam 120 and the second layer of adhesive 122 may be fabricated from the same adhesive or different adhesives. For instance, the perimeter dam 120 may be a curable adhesive, such as a curable hot-melt, while the second layer 122 is not cured. Also, the perimeter dam may be fabricated from a non-curable adhesive, such as a butyl rubber compound, while the second layer 122 is a curable adhesive. In another embodiment, both the dam 120 and the second layer 122 can be made from curing adhesives. The adhesive can also be a low moisture vapor transmission rate adhesive for the dam 120 and a high or low moisture vapor transmission rate adhesive for the second layer 122. Where low moisture vapor adhesives have less than 3 grams H2O/meter2/per day at 37 C. High is greater than 40.

Finally, one of skill should appreciate that the adhesives 120 and 122 can selectively be a transparent adhesive or coating. For instance solar panels can be fabricated such that the photovoltaic semiconductor material may be placed on an interior surface of the back panel 108 of a solar panel. It should be readily understood that the manufacturing techniques of the present invention can be applied to manufacture such a solar panel. In this particular embodiment, the adhesives 120 and 122 of the present invention are transparent or clear adhesives so that the solar energy may pass through the top substrate and the adhesive 120 and 122 for collection and distribution on the photovoltaic semiconductor material located on the back panel 108.

FIG. 4 illustrates the perimeter dam 120 formed by the first application of adhesive and the second layer of adhesive formed over the photovoltaic material, generally identified 122. Portions of the substrate 104 containing the photovoltaic semiconductor material that may not be covered by an adhesive layer can be masked or application of the adhesive can be arranged to avoid adhesive being applied to that particular portion of the substrate. Typically portions of the substrate 104 must be free of adhesives in order to connect module wires directly to the buss bars on the TFPP.

Figure 5A:
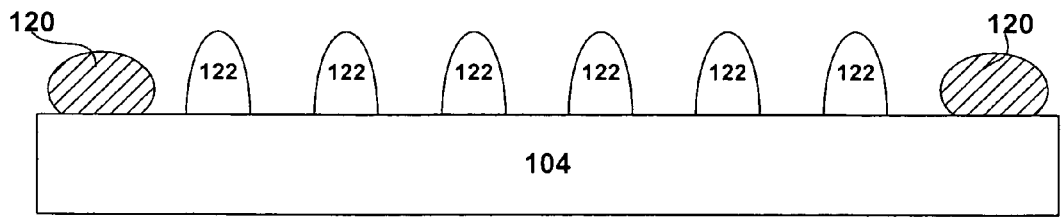
FIGS. 5A-5C are schematic cross-sectional views of the adhesive layers in accordance with the present invention during the leveling process.
Figure 5B:
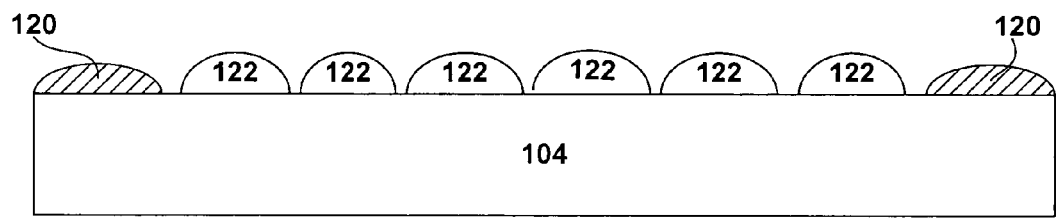
Figure 5C:
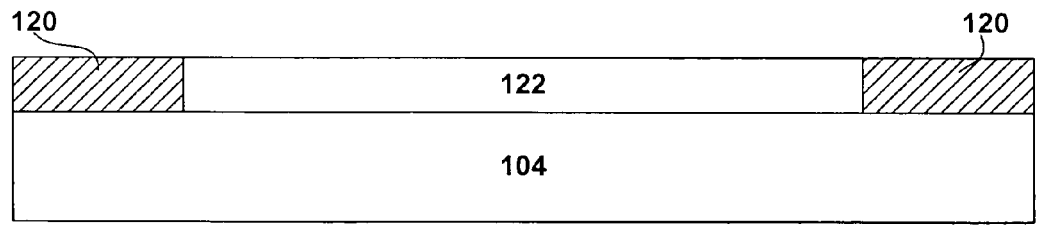

FIGS. 5A-5C are schematic cross-sectional views of the adhesive layers in accordance with the present invention. Generally, the first and second layers of adhesive are applied in a bead form (e.g., in columns having a particular thickness and generally spaced apart). The layers can also be applied using any other technique including roll coating or spray coating. As shown in FIG. 5A, the first layer of adhesive used to form the perimeter dam 120 is generally applied as a thicker bead than the beads corresponding to the second adhesive layer, as described above. Unless otherwise claimed, one of ordinary skill in the art will readily appreciate that the particular application of adhesive layers is not particularly important so long as the adhesive layers achieve the functionality described herein.

Over a relatively short period of time, depending on the precise adhesive used, the beads becomes partially leveled as illustrated in FIG. 5B. Partial leveling typically is characterized with the bead thickness shorter than the initial thickness of the bead of adhesive when first applied. In addition, the spacing between beads becomes smaller than when the beads were first applied. The leveling process generally continues until the beads become fully leveled, as illustrated in FIG. 5C.

After the adhesive layers have been applied and are substantially leveled, the back panel 108 can then be applied to the adhesive before the adhesives open time has expired. By pressing the multi-layered structure with a platen or running the structure through a set of rollers, wetting of the adhesive to the substrates can be aided or sped up and therefore the subsequent adhesion of the photovoltaic material and the back panel occurs more quickly. When using a hot melt adhesive, the adhesive will gain strength by transforming from liquid to semi-solid and finally solid upon cooling. When using a curing hot melt adhesive, the adhesive will gain strength by curing and cooling from liquid to semi-solid to solid. When using a multi-component adhesive, the adhesive will gain strength by curing. The pumpable, liquid adhesive gains strength by curing, cooling or both. The strength gain allows the completed TFPP to be handled sooner in subsequent operations including placement in the field.

Figure 6:
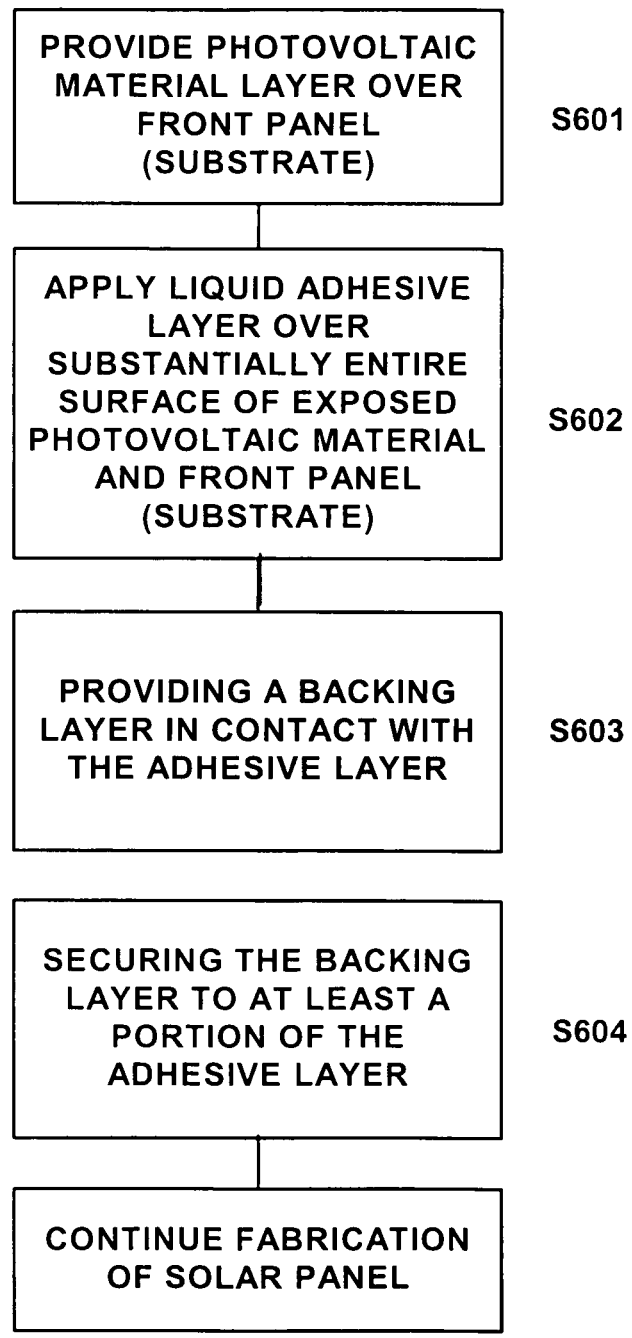
FIGS. 6 and 7 are flow diagrams schematically illustrating the steps of a method for fabricating a thin film photovoltaic panel in accordance with the present invention.

FIG. 6 is a flow diagram schematically illustrating the steps of a method of fabricating a TFPP in accordance with the present invention. As shown in FIG. 6, in the first step of the method, shown as step S601, a photovoltaic layer is provided over a front panel (or substrate) 104. In the usual case, the photovoltaic layer will have been deposited by an appropriate process to one surface of a front panel, such as that described above. In addition, the photovoltaic layer usually will have been separated into individual photovoltaic cells, or photocells. Each of the photocells will have been electrically connected, as appropriate to the design of the solar cell. Such matters may be appropriately designed or selected by those of skill in the art, and the present invention is not limited to any particular form of photovoltaic material layer.

In the second step of the method, shown in FIG. 6 as step S602, an adhesive layer 106 is provided over substantially the entire surface of the exposed photovoltaic layer 102 and front panel (or substrate) 104. As described above, the adhesive layer 106 is generally applied in a liquid form.

In the third step of the present invention (S603), the respective layers of the TFPP, including the front panel 104, photovoltaic material 102, adhesive layers 106 and backing panel 108 are brought together, with the adhesive layer 106 generally in contact with the backing panel 108 to secure these components into an assembled TFPP.

In an optional fourth step, a force and/or heat is applied to the TFPP structure (S604). The force can be applied by any known means in the art. For example, the TFPP structure may pressed together with a platen or the TFPP structure may be run through a set of rollers. Depending on the adhesive, the substrate, photovoltaic material, adhesive layers and backing panel may also be brought together by the presence of vacuum and/or heat. Application of such forces helps the adhesive layer to wet the surfaces to which it will be attached, to provide an intimate, complete attachment. The adhesive should be applied in a manner so as to avoid the formation of air pockets or bubbles between the respective front and back panels. As is known in the art, such air pockets or bubbles are aesthetically unappealing and may lead to performance degradation.

Figure 7:
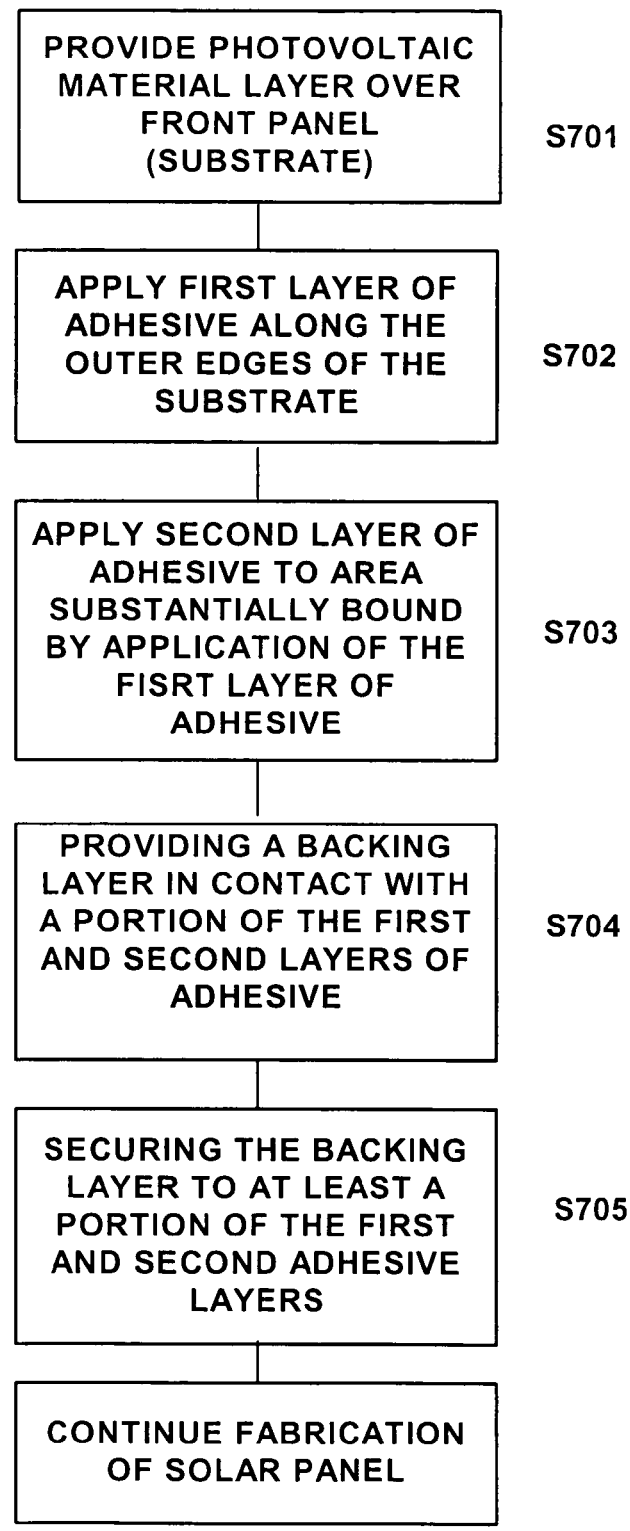

FIG. 7 is a flow diagram schematically illustrating the steps of another method of fabricating a TFPP in accordance with the present invention. As shown in step S701 in FIG. 7, the first step of the method is to provide a photovoltaic layer over a front panel (or substrate) 104. This step is substantially identical to step S601 as discussed above.

In the second step of the method, a first adhesive is applied to the outer edges of the substrate 104 to form a perimeter dam 120, as described above (S702).

In the third step of the method (S703), a second adhesive layer is applied within the general perimeter bounded by the first adhesive layer, as provided in the second step.

In the fourth step of the present invention (S704), the respective layers of the TFPP, including the substrate, photovoltaic material, adhesive layers and backing panel are brought together. This step (S704) is substantially identical to step S603, as discussed above.

In the optional fifth step, a force and/or heat is then applied to the TFPP structure (S705). This step (S705) is substantially identical to step S604, as discussed above.

In general, as the TFPP is assembled, the module wires 118 are first electrically connected to the photovoltaic layer 102. When the backing panel 108 and the front panel 104 (together with the photovoltaic layer 102) are brought together, the module wire 118 will extend through the applied adhesive layers 106 and into and through the module wire openings 120. The module wire openings 120 may be filled with the module wire adhesive 122 at any appropriate time.

Although the invention has been shown and described with respect to certain preferred embodiments, equivalent alterations and modifications will occur to others skilled in the art upon reading and understanding this specification and the annexed drawings. In particular regard to the various functions performed by the above described integers (components, assemblies, devices, compositions, steps, etc.), the terms (including a reference to a "means") used to describe such integers are intended to correspond, unless otherwise indicated, to any integer which performs the specified function of the described integer (i.e., that is functionally equivalent), even though not structurally equivalent to the disclosed structure which performs the function in the herein illustrated exemplary embodiment or embodiments of the invention. In addition, while a particular feature of the invention may have been described above with respect to only one of several illustrated embodiments, such feature may be combined with one or more other features of the other embodiments, as maybe desired and advantageous for any given or particular application.

What is claimed is:

1. A method for manufacturing a thin film photovoltaic panel comprising:
    attaching a photovoltaic material layer directly onto a planar surface of a substrate having a plurality of edges, wherein the substrate is a transparent front panel of the thin film photovoltaic panel;
    applying a first adhesive layer in the form of a perimeter dam along the plurality of edges of the planar surface of the substrate;
    applying a second adhesive layer on a portion of the photovoltaic material layer after attaching the photovoltaic layer, wherein at least a portion of the second adhesive layer is bounded the perimeter dam on the planar surface of the substrate;
    applying the photovoltaic material layer and the substrate to a backing panel once the first and second adhesive layers have been applied to the planar surface; and
    securing the photovoltaic material layer and the substrate to the backing panel with at least a portion of the first adhesive layer and second adhesive layer once the photovoltaic material layer and the substrate have been applied to the backing panel.

2. The method of claim 1, wherein the first adhesive layer is a curing adhesive.

3. The method of claim 1, wherein the second adhesive layer is a curing adhesive.

4. The method of claim 1, wherein the first adhesive layer is a curing adhesive and the second adhesive layer is a non-curing adhesive.

5. The method of claim 1, wherein the first adhesive layer is a non-curing adhesive and the second adhesive layer is a curing adhesive.

6. The method of claim 1, wherein the first adhesive layer is a curing adhesive and the second adhesive layer is a curing adhesive.

7. The method of claim 1, wherein the first adhesive layer is a non-curing adhesive and the second adhesive layer is a non-curing adhesive.

8. The method of claim 1, wherein the first adhesive layer is applied having an initial thickness greater than an initial thickness of the second adhesive layer.

9. The method of claim 8, wherein the first adhesive layer is applied with an automated x-y axis application.

10. The method of claim 1, wherein the second adhesive layer is applied at a higher temperature than a temperature in which the first adhesive layer was applied.

11. The method of claim 1, wherein the second adhesive layer is applied at a lower viscosity than a viscosity of the first adhesive layer during application of the first adhesive layer.

12. The method of claim 1, wherein the first adhesive layer is a hot melt adhesive and the second adhesive layer is a curing adhesive.

13. The method of claim 1, wherein the first adhesive layer is a curing adhesive and the second adhesive layer is a hot melt adhesive.

14. The method of claim 1 further comprising:
    waiting for the first and second adhesive layers to level before applying the photovoltaic material layer and the substrate to the backing panel.

15. The method of claim 1, wherein the first adhesive layer has a low moisture vapor transmission rate and the substrate and backing panel are glass.

16. The method of claim 1 further comprising:
wetting the planar surface of the substrate and an inner surface of the backing panel with the adhesives by applying at least one of heat or force to the thin film photovoltaic panel after applying the photovoltaic material layer and the substrate to the backing panel.

17. The method of claim 1 wherein attaching the photovoltaic layer to the substrate includes depositing the photovoltaic layer by at least one of chemical vapor deposition, physical vapor deposition, or sputtering.

18. The method of claim 17 further comprising:
etching the photovoltaic layer to form a plurality of individual photocells after the photovoltaic layer is attached to the substrate.

* * * * *